United States Patent
Meyer et al.

(10) Patent No.: US 12,135,355 B2
(45) Date of Patent: Nov. 5, 2024

(54) DEVICE FOR SENSING A HIGH-FREQUENCY EVENT SIGNAL IN A ROTATING ELECTRICAL MACHINE

(71) Applicant: INNOMOTICS GMBH, Nuremberg (DE)

(72) Inventors: Martin Meyer, Nuremberg (DE); Dirk Scheibner, Nuremberg (DE); Jürgen Schimmer, Nuremberg (DE)

(73) Assignee: Innomotics GmbH, Nuremberg (DE)

( * ) Notice: Subject to any disclaimer, the term of this patent is extended or adjusted under 35 U.S.C. 154(b) by 64 days.

(21) Appl. No.: 17/785,766

(22) PCT Filed: Sep. 30, 2020

(86) PCT No.: PCT/EP2020/077305
§ 371 (c)(1),
(2) Date: Jun. 15, 2022

(87) PCT Pub. No.: WO2021/121700
PCT Pub. Date: Jun. 24, 2021

(65) Prior Publication Data
US 2023/0053974 A1    Feb. 23, 2023

(30) Foreign Application Priority Data
Dec. 16, 2019    (EP) .................................... 19216617

(51) Int. Cl.
*G01R 31/34* (2020.01)
*H02K 11/20* (2016.01)
(Continued)

(52) U.S. Cl.
CPC ........... *G01R 31/343* (2013.01); *G01R 31/34* (2013.01); *G01R 31/346* (2013.01); *H02K 11/20* (2016.01); *H02K 11/35* (2016.01); *H02K 15/00* (2013.01)

(58) Field of Classification Search
CPC .... G01R 31/343; G01R 31/34; G01R 31/346; H02K 11/20; H02K 15/00; H02K 11/35
(Continued)

(56) References Cited

U.S. PATENT DOCUMENTS

| | | |
|---|---|---|
| 5,917,334 A | 6/1999 | Grunewald et al. |
| 6,452,416 B1 | 9/2002 | Kaneda et al. |

(Continued)

FOREIGN PATENT DOCUMENTS

| | | |
|---|---|---|
| DE | 10 2005 027 670 A1 | 1/2007 |
| EP | 0 662 220 B1 | 11/1996 |

(Continued)

OTHER PUBLICATIONS

PCT International Search Report and Written Opinion of International Searching Authority mailed Jan. 22, 2021 corresponding to PCT International Application No. PCT/EP2020/077305 filed Sep. 30, 2020.

*Primary Examiner* — Raul J Rios Russo
(74) *Attorney, Agent, or Firm* — Henry M. Felereisen LLC

(57) ABSTRACT

Apparatus for sensing a high-frequency event signal in a rotating electrical machine includes a HF evaluation apparatus, and at least two sensors arranged in the rotating electrical machine and designed to sense a low-frequency sensor signal. Each of the at least two sensors Includes an antenna for decoupling the high-frequency event signal from a high-frequency electromagnetic field of the rotating electrical machine. A common coupling element connects the at least two sensors to the HF evaluation apparatus. The coupling element designed to transfer the high-frequency event signal from at least one of the at least two sensors to the HF evaluation apparatus and to decouple the low-frequency sensor signal.

20 Claims, 3 Drawing Sheets

(51) Int. Cl.
*H02K 11/35* (2016.01)
*H02K 15/00* (2006.01)

(58) Field of Classification Search
USPC .................................................. 324/765.01
See application file for complete search history.

(56) References Cited

U.S. PATENT DOCUMENTS

| | | | | |
|---|---|---|---|---|
| 2004/0189115 | A1* | 9/2004 | Preisinger | H02K 11/40 |
| | | | | 310/68 R |
| 2012/0098552 | A1* | 4/2012 | Franklin | G01R 31/343 |
| | | | | 324/679 |
| 2012/0242348 | A1* | 9/2012 | Elze | G01R 31/343 |
| | | | | 324/551 |
| 2013/0054160 | A1* | 2/2013 | Younsi | G01R 31/343 |
| | | | | 702/58 |
| 2013/0057228 | A1* | 3/2013 | Kunz | G01R 31/343 |
| | | | | 322/99 |
| 2018/0120380 | A1* | 5/2018 | Giussani | G01R 23/02 |

FOREIGN PATENT DOCUMENTS

| | | |
|---|---|---|
| EP | 3 570 052 A1 | 11/2019 |
| SU | 1057365 A1 | 11/1983 |

* cited by examiner

DEVICE FOR SENSING A HIGH-FREQUENCY EVENT SIGNAL IN A ROTATING ELECTRICAL MACHINE

CROSS-REFERENCES TO RELATED APPLICATIONS

This application is the U.S. National Stage of International Application No. PCT/EP2020/077305, filed Sep. 30, 2020, which designated the United States and has been published as International Publication No. WO 2021/121700 A1 and which claims the priority of European Patent Application, Ser. No. 19/216,617.1, filed Dec. 16, 2019, pursuant to 35 U.S.C. 119(a)-(d).

BACKGROUND OF THE INVENTION

The Invention relates to an apparatus for sensing a high-frequency event signal in a rotating electrical machine.

The invention further relates to a method for sensing a high-frequency event signal in a rotating electrical machine.

What is more the invention relates to a control unit with means for carrying out such a method.

Furthermore the invention relates to a computer program for carrying out such a method when executed in a control unit.

Beyond this the invention relates to a computer program product with a computer program.

Moreover the invention relates to a rotating electrical machine with at least one such apparatus for sensing a high-frequency event signal.

An apparatus of this type is used for example in rotating electrical high-voltage machines, in particular high-voltage motors and high-voltage generators, which are able to be operated with a voltage of at least ikV.

A high-frequency event signal is to be understood for example as a pulsed signal in a frequency range of 100 kHz to 100 MHz. The pulse has a rectangular, a Gaussian or another pulse shape. These types of high-frequency event signals arise for example during partial discharges, which frequently occur in rotating electrical machines. Partial discharges involve local discharges, which are caused for example by inhomogeneities in an insulation material and, under some circumstances, lead over the long term to the failure of the insulation and thus to a failure of the high-voltage machine. Therefore rotating electrical high-voltage machines are regularly examined for partial discharges. In particular, in the event of a marked change in the frequency of partial discharges, it is necessary to find the cause. In larger rotating electrical machines in particular the location of partial discharges can only be sensed to a limited extent. Therefore a number of sensors are evaluated in order to achieve a monitoring that Is as seamless as possible.

Patent EP 0 662 220 B1 describes a method for decoupling a high-frequency event signal from a high-frequency electromagnetic field in a large electrical machine with a stator carrying an electrical winding and equipped with at least one temperature sensor. The high-frequency event signal is to be picked up by a temperature sensor used as an antenna. In this way the outlay in apparatus involved in decoupling the event signal is kept low, and when a plurality of temperature sensors are used it is possible to localize damage where the event signal was caused.

The publication EP 3 570 052 A1 describes a method for measuring a pulsed high-frequency event signal, in particular a partial discharge, in a rotating electrical machine. In order to obtain a simple and low-cost implementation compared to the prior art, it is proposed that the event signal from a high-frequency electromagnetic field is decoupled with the aid of a sensor during operation of the rotating electrical machine, wherein a pulse-shaped low-frequency envelope signal is determined from the decoupled event signal with the aid of a high-frequency sensing circuit, wherein, when an amplitude of the envelope signal exceeds a threshold value, an event signal is sensed.

The underlying object of the invention is to specify an apparatus for sensing a high-frequency event signal in a rotating electrical machine, which, in comparison to the prior art, is simple and inexpensive to implement.

SUMMARY OF THE INVENTION

The object is achieved in accordance with the Invention by an apparatus for sensing a high-frequency event signal in a rotating electrical machine, wherein at least two sensors for sensing a low-frequency sensor signal are arranged in the rotating electrical machine, wherein the at least two sensors each comprise an antenna for decoupling the high-frequency event signal from a high-frequency electromagnetic field of the rotating electrical machine, wherein the sensors are connected via a common, in particular reactive, coupling element to a common HF evaluation apparatus, wherein the common coupling element is embodied for transferring the high-frequency event signal from at least one of the sensors to the common HF evaluation apparatus and for decoupling the low-frequency sensor signal.

Furthermore, the object Is achieved in accordance with the invention by a method for sensing a high-frequency event signal In a rotating electrical machine, wherein at least two sensors for sensing a low-frequency sensor signal are arranged in the rotating electrical machine, wherein the at least two sensors each comprise an antenna for decoupling the high-frequency event signal from a high-frequency electromagnetic field of the rotating electrical machine, wherein the sensors are connected via a common, in particular reactive, coupling element to a common HF evaluation apparatus, wherein the high-frequency event signal is transferred from at least one of the sensors via the common coupling element to the common HF evaluation apparatus and is decoupled from the low-frequency sensor signal.

The object is further achieved In accordance with the invention by a control unit with means for carrying out such a method.

What is more the object is achieved in accordance with the invention by a computer program for carrying out such a method when executed in a control unit.

Beyond this the object is achieved in accordance with the invention by a computer program product with a computer program.

Moreover the object is achieved in accordance with the invention by a rotating electrical machine with at least one such apparatus for sensing a high-frequency event signal.

The advantages and preferred embodiments given below with regard to the apparatus can be transferred by analogy to the method, the control unit, the computer program, the computer program product and the rotating electrical machine.

The idea behind the invention is that a high-frequency event signal, for example a partial discharge, can be sensed during the operation of a rotating electrical machine with minimal hardware outlay. The components such as cables, transformers, filters etc. connected to the machine, in which such a high-frequency event signal is able to be sensed also belong to the rotating electrical machine. Since, in particular in rotating electrical high-voltage machines, the location of high-frequency event signals is only able to be sensed to a restricted extent, at least two sensors are used, which are connected via a common, in particular reactive, coupling element to a common HF evaluation apparatus. A reactive coupling element is an, in particular passive, electronic module, which is essentially composed of energy-storage components such as coils and capacitors. A reactive module is therefore a very low-loss module. In this way a number of sensors are able to be evaluated via one HF evaluation apparatus, which, because of the reduced hardware outlay, leads to a reduction in costs. The circuit is also smaller and simpler.

The sensors are embodied for example as a capacitive or inductive coupling apparatus, as a directional coupler, as a temperature sensor or as another sensor. Since the sensors for sensing a low-frequency sensor signal in the rotating electrical machine are already present, no additional sensor system is required and modification of the rotating electrical machine for the sensing of the high-frequency event signal is not required. A low-frequency sensor signal is for example a signal with a frequency of less than 1 kHz, while the high-frequency event signal lies in a frequency range of 100 kHz to 100 MHz. The decoupling of the high-frequency event signal from a high-frequency electromagnetic field of the rotating electrical machine is carried out by means of an antenna, wherein for example leads of the sensor are used as an antenna, whereby no additional modifications are required. The common coupling element has a bandpass characteristic or a highpass characteristic for example, so that it is embodied, as well as for transferring the high-frequency event signal from at least one of the sensors to the common HF evaluation apparatus, for decoupling of the low-frequency sensor signal.

The execution sequence is controlled by a control unit. The means for carrying out the method comprise a computer program and for example a microcontroller or another programmable logic chip. The control unit is assigned to the microcontroller for example.

In a preferred form of embodiment the common, in particular reactive, coupling element has a transformer. A transformer provides a very good decoupling between the sensors and the HF evaluation apparatus in the frequency range of the low-frequency sensor signal. A transformer further has low losses in the frequency range of the high-frequency event signal and can be realized both at low cost and also as a compact device.

Especially advantageously the transformer has primary-side windings and a secondary-side winding, wherein each of the at least two sensors is allocated to one primary-side winding, wherein the HF-evaluation apparatus is allocated to the secondary-side winding and wherein the primary-side windings are each connected to the secondary-side winding in each case. The windings have wires made of copper for example, in order to minimize losses, in particular ohmic losses.

If for example a partial discharge pulse Is received by at least one of the sensors and transferred to the respective primary-side winding, a pulse is induced in the secondary-side winding, which is received by the HF evaluation apparatus and further processed. The other primary-side windings have a relatively high-Impedance load, so that they only exert a negligible influence. With this type of circuitry of the transformer a very good decoupling between the sensors and the HF apparatus in the frequency range of the low-frequency sensor signal is achieved. Further a low-loss transfer of a high-frequency event signal from each of the sensors is made possible at low cost and in a compact manner.

In a further advantageous embodiment the transformer has a magnetic core, in particular an annular ferrite core. Such a magnetic core is made of a soft magnetic material, with high magnetic saturation flux density and high magnetic permeability for example. Such soft magnetic materials are for example iron, a few steels, nickel-iron alloys, cobalt-iron alloys or fenites. The magnetic flux is bundled and guided with low losses by such a magnetic core. Further, the dimensions of the transformer are reduced by increasing the Inductance of the windings.

Especially advantageously the primary-side and secondary-side windings are arranged twisted together with one another, in order to achieve as good as possible a coupling at higher frequencies, in particular in the MHz range.

In a preferred form of embodiment the sensors are each connected to an LF evaluation apparatus for evaluation of the low-frequency sensor signal, wherein the LF evaluation apparatus is embodied for decoupling the high-frequency event signal. For example, the input impedance of the LF evaluation apparatus is capacitive, so that for the low-frequency sensor signal this appears as high-impedance and for the high-frequency event signal essentially as a short circuit. Such a circuit arrangement makes possible a simultaneous evaluation of the low-frequency sensor signal and the high-frequency event signal.

Especially advantageously at least one of the sensors is embodied as a temperature sensor. The temperature sensor comprises a temperature-dependent resistor for example, which In particular Is made of platinum. Leads of the temperature sensor are used as an antenna for decoupling the high-frequency event signal from the high-frequency electromagnetic field for example. In particular such a temperature sensor is already present in the rotating electrical machine. Since the low-frequency measurement of the temperature as well as the sensing of the pulsed high-frequency event signal do not noticeably affect one another because of the different frequency ranges, such a temperature sensor as a sensor is simple, low-cost and space-saving.

In a further advantageous embodiment the low-frequency sensor signal and the high-frequency event signal are differential signals. Such signals do not have any reference to ground and are therefore less susceptible, in particular to electromagnetic disturbances from the environment.

In a further advantageous form of embodiment the sensors are each able to be connected separately to the common, in particular reactive, coupling element. The sensors are for example able to be connected Individually via switches, which in particular are able to be controlled by a control unit, to the coupling element, whereby a high-frequency event signal Is able to be localized more precisely.

BRIEF DESCRIPTION OF THE DRAWING

The invention will be described and explained below in greater detail with the aid of the exemplary embodiments shown in the figures.

In the figures.

DETAILED DESCRIPTION OF PREFERRED EMBODIMENTS

Figure 1:
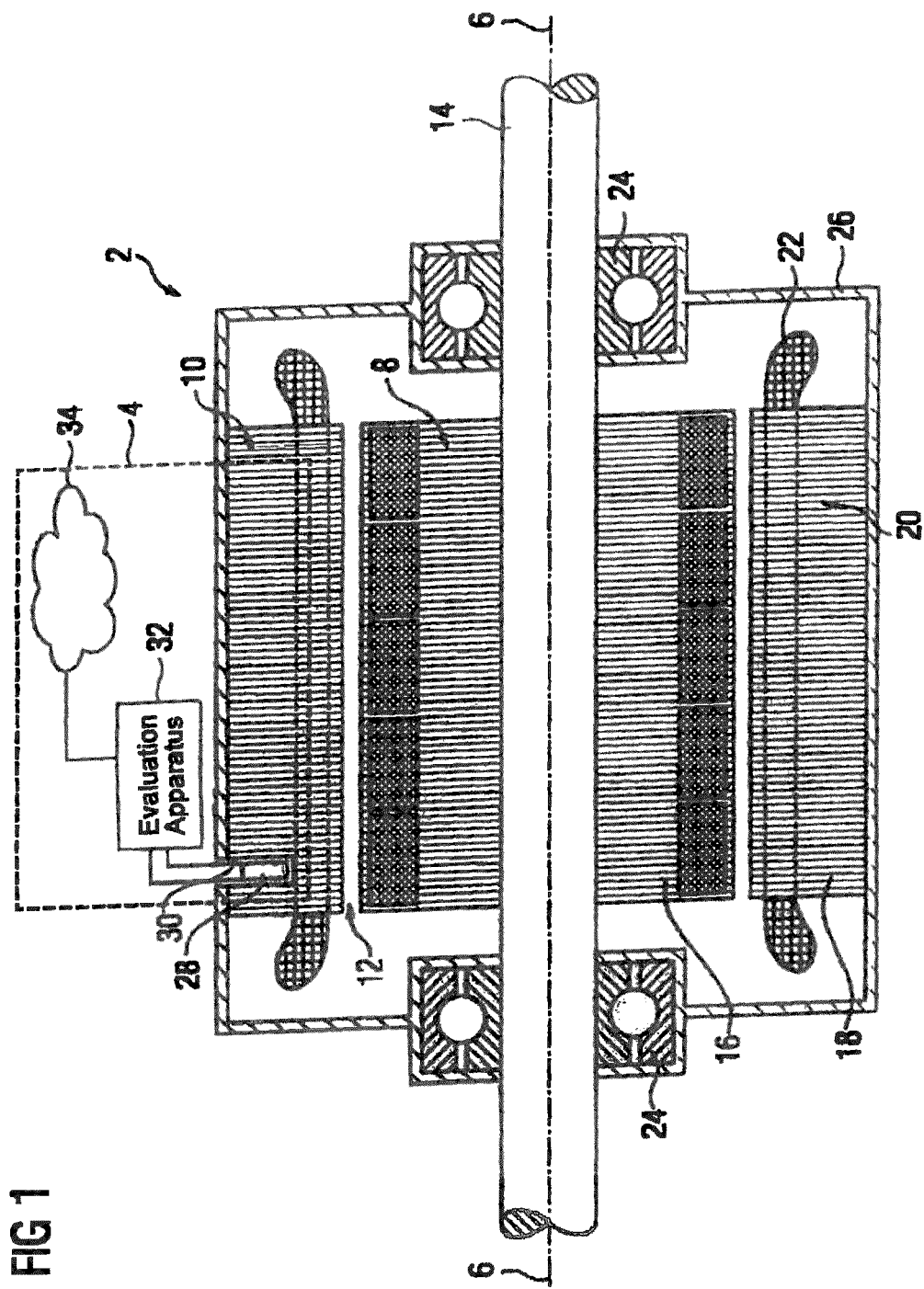
FIG. 1 shows a longitudinal section of a rotating electrical machine with a sensor apparatus and FIG. 2 shows a schematic diagram of a first embodiment of an apparatus for sensing a high-frequency event signal in a rotating electrical machine and FIG. 3 shows a schematic diagram of a second embodiment of an apparatus for sensing a high-frequency event signal in a rotating electrical machine.

The exemplary embodiments explained below involve preferred forms of embodiment of the invention. In the exemplary embodiments the components of the forms of embodiment described each represent Individual features of the invention to be considered Independently of one another, which each also develop the invention further independently of one another and thus are also to be seen individually or in a combination other than that shown as an element of the invention. Furthermore the forms of embodiment described are also able to be supplemented by further features of the invention already described.

The same reference characters have the same meaning in the various figures.

FIG. 1 shows a longitudinal section of a rotating electrical machine 2 with an apparatus 4 for sensing a high-frequency event signal. The rotating electrical machine 2 is embodied by way of example as a permanently-excited synchronous machine, wherein further machine types, such as for example asynchronous machines, likewise belong to the subject matter of the invention.

The rotating electrical machine 2 has rotor 8 able to be rotated about an axis of rotation 6 and a stator 10 surrounding the rotor 8, wherein a gap 12, which is in particular embodied as an air gap, is located between the rotor 8 and the stator 10. The axis of rotation 6 defines an axial direction, a circumferential direction and a radial direction. The rotor 8 comprises a shaft 14 and a laminated rotor core 16. The stator 10 comprises a laminated stator core 18 with stator windings 20, wherein the laminated stator core 18 is constructed from a plurality of layered electrical steel sheets. The stator windings 20 run in the axial direction through the laminated stator core 18 and embody winding heads 22 at the axial ends of the laminated stator core 18. The shaft 14 of the rotor 8 is supported by bearings 24. The rotor 8 and the stator 10 are accommodated in a closed machine housing 26.

The apparatus 4 for sensing a high-frequency event signal comprises sensors 28, which are arranged for example in a channel 30, in the area of the stator windings 20. The channel 30 runs radially for example through the laminated stator core 18. As an alternative the channel 30 is arranged running in another direction, for example in the circumferential direction or in the axial direction, through the stator 10 or through the rotor 8. The arrangement of the sensor apparatus 4 is only shown schematically for reasons of clarity, wherein in particular only one sensor 28 is shown in FIG. 1. The sensors 28 are connected to an evaluation apparatus 32, which is connected in its turn to a central IT infrastructure 34. A central IT infrastructure 34 is for example at least a local computer system and/or a Cloud. The central IT infrastructure 34 provides storage space, computing power and/or application software. In the Cloud storage space, computing power and/or application software are made available as a service via the Internet. The digital data transfer to the central IT infrastructure 34 takes place wirelessly, by wire or optically. For example, the data is transferred via Bluetooth or WLAN.

Figure 2:
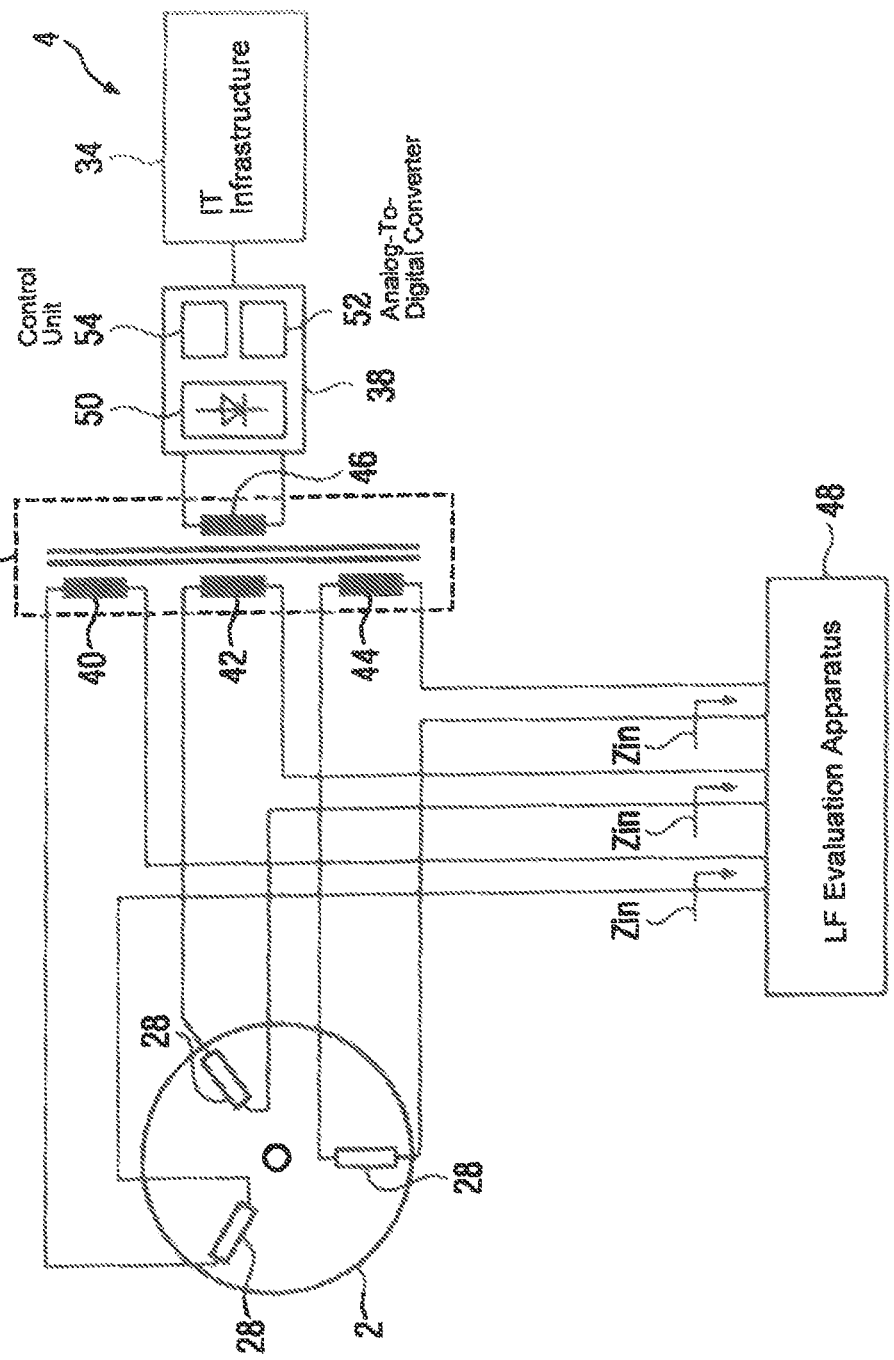

FIG. 2 shows a schematic diagram of a first embodiment of an apparatus 4 for sensing a high-frequency event signal in a rotating electrical machine 2, wherein the rotating electrical machine 2, as well as the arrangement of the sensors 28 in the rotating electrical machine 2, are shown heavily abstracted for reasons of clarity. For example three sensors 28 are used, wherein one of the three phases of the rotating electrical machine 2 is allocated one sensor. A high-frequency event signal is to be understood for example as a pulsed signal in a frequency range from 100 kHz to 100 MHz. The pulse has a rectangular, a Gaussian or another pulse shape. The high-frequency event signal is coupled out by means of the sensor 28 from a high-frequency electromagnetic field during operation of the rotating electrical machine 2. The high-frequency electromagnetic field is in particular created by the rotating electrical machine 2.

The sensors 28 are embodied by way of example as a temperature sensor, which comprise a temperature-dependent resistor in each case, which is made of platinum for example, and leads, wherein the leads are used as an antenna for decoupling the high-frequency event signal. The sensors 28 are connected via a common, in particular reactive, coupling element 36 to a common HF evaluation apparatus 38, wherein the common coupling element 36 is embodied for transfer of the high-frequency event signal from at least one of the sensors 28 to the common HF evaluation apparatus 38 and for decoupling the low-frequency sensor signal. The coupling element 36 has a transformer, which has primary-side windings 40, 42, 44 and a secondary-side winding 46. The windings 40, 42, 44,46 have leads made of copper for example, in order to minimize losses, in particular ohmic losses. Optionally the common, in particular reactive, coupling element 36 comprises components, for matching power and/or impedance for example, such as coils and/or capacitors. Each of the sensors 28 is assigned a primary-side winding 40, 42, 44, wherein the HF evaluation apparatus 38 is assigned to the secondary-side winding 46. The primary-side windings 40, 42, 44 are each coupled to the secondary-side winding 46 for transfer of the high-frequency event signal. A transformer with three primary-side windings 40, 42, 44 is shown by way of example. As an alternative the transformer, depending on the number of sensors 28 to be connected, has two, four or more primary-side windings 40, 42, 44. The transformer has a magnetic core, in particular an annular ferrite core, wherein the primary-side and secondary-side windings 40, 42, 44, 46 are twisted together with one another and arranged wound around the ferrite core.

In addition the sensors 28 are each connected to a common LF evaluation apparatus 48 for evaluation of the low-frequency sensor signal, wherein each of the sensors 28 is connected to an input channel of the LF evaluation apparatus 48. As an alternative each of the sensors 28 Is allocated to a dedicated LF evaluation apparatus 48. In particular the low-frequency sensor signal and the high-frequency event signal are differential signals. The primary-side windings 40, 42, 44 are each connected in series with the LF evaluation apparatus 48, wherein the low-frequency sensor signal is decoupled via the transformer, which has a bandpass characteristic, and wherein the high-frequency event signal is decoupled in the LF evaluation apparatus 48 via the input impedance Zin. In particular the input impedance Zin of the LF evaluation apparatus 48 is capacitive, so that this appears as high-impedance for the low-frequency sensor signal and essentially as a short circuit for the high-frequency event signal. In particular the line lengths between the LF evaluation apparatus 48 and the coupling element 36 are electrically short, so that the short circuit after the line transformation does not noticeably worsen the transfer of the HF signal between the sensors 28 and the coupling element 36.

If for example a part discharge pulse is received from at least one of the sensors 28 and is transferred to the respective primary-side winding 40, 42, 44, a pulse is induced in the secondary-side winding 46, which is received by the HF evaluation apparatus 38 and further processed. The other primary-side windings 40, 42, 44, in particular through the temperature-dependent resistor, have a relatively high-impedance load, so that they only exert a negligible influence.

The common HF-evaluation apparatus 38 in particular has a high frequency sensing circuit 50 for sensing of the high-frequency event signal, an analog-to-digital converter 52 for digitizing the sensed signal and a control unit 54 for controlling the execution sequence of the method. The HF evaluation apparatus 38 is further connected to a central IT infrastructure 34. The further design of the apparatus 4 in FIG. 2 corresponds to the design in FIG. 1.

Figure 3:
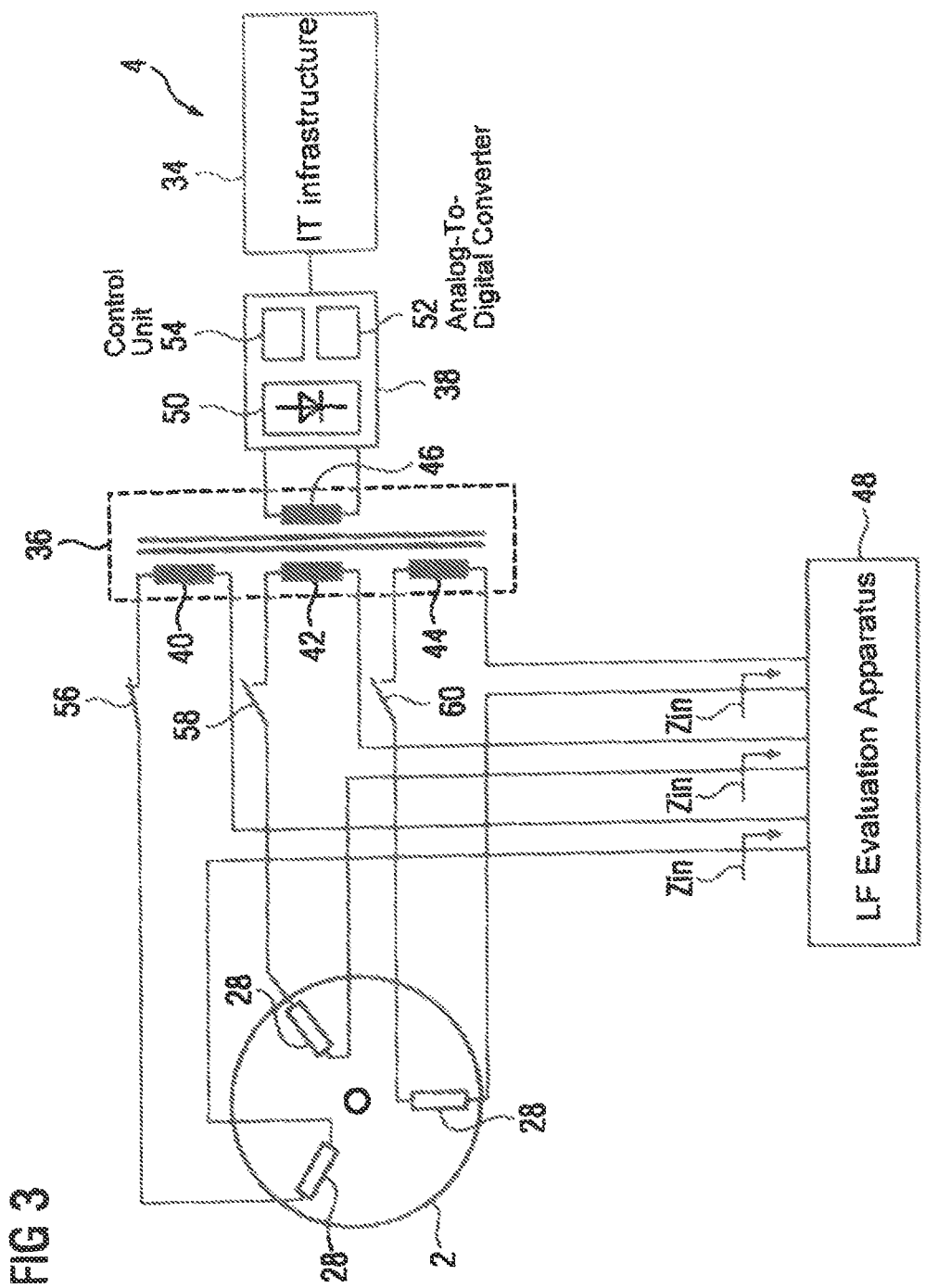

FIG. 2 shows a schematic diagram of a second embodiment of an apparatus 4 for sensing a high-frequency event signal in a rotating electrical machine 2. The sensors 28 are able to be connected Individually via switches 56, 58, 60, which are able to be controlled for example via the control unit 54, to the primary-side windings 40, 42, 44 of the common coupling element 36 designed as a transformer, whereby a high-frequency event signal is able to be localized more precisely. The further design of the apparatus 4 in FIG. 3 corresponds to the design in FIG. 2.

In summary the Invention relates to an apparatus 4 for sensing a high-frequency event signal in a rotating electrical machine 2, wherein at least two sensors 28 for sensing a low-frequency sensor signal are arranged in the rotating electrical machine 2, wherein the at least two sensors 28 each have an antenna for decoupling the high-frequency event signal from a high-frequency electromagnetic field of the rotating electrical machine 2. In order to achieve a simple and low-cost implementation in comparison with the prior art it is proposed that sensors 28 are connected via a common, in particular reactive, coupling element 36 to a common HF evaluation apparatus 38, wherein the common coupling element 36 is embodied to transfer the high-frequency event signal from at least one of the sensors 28 to the common HF evaluation apparatus 38 and to decouple the low-frequency sensor signal.

The invention claimed is:

1. Apparatus for sensing a high-frequency event signal in a rotating electrical machine, said apparatus comprising:
   a HF evaluation apparatus;
   at least two sensors arranged in the rotating electrical machine and designed to sense a low-frequency sensor signal, each of the at least two sensors comprising an antenna for decoupling the high-frequency event signal from a high-frequency electromagnetic field of the rotating electrical machine; and
   a coupling element, in particular reactive coupling element, connecting the at least two sensors to the HF evaluation apparatus, said coupling element designed to transfer the high-frequency event signal from at least one of the at least two sensors to the HF evaluation apparatus and to decouple the low-frequency sensor signal.

2. The apparatus of claim 1, wherein the coupling element includes a transformer.

3. The apparatus of claim 2, wherein the transformer includes primary-side windings connected to the at least two sensors in one-to-one correspondence, and a secondary-side winding, with the primary-side windings being each coupled to the secondary-side winding, said HF-evaluation apparatus being connected to the secondary-side winding.

4. The apparatus of claim 2, wherein the transformer has a magnetic core, in particular an annular ferrite core.

5. The apparatus of claim 3, wherein the primary-side windings and the secondary-side winding of the transformer are arranged twisted with one another.

6. The apparatus of claim 1, further comprising an LF evaluation apparatus designed to evaluate the low-frequency sensor signal to decouple the high-frequency event signal, said at least two sensors being each connected to the LF evaluation apparatus.

7. The apparatus of claim 1, wherein at least one of the at least two sensors is embodied as a temperature sensor.

8. The apparatus of claim 1, wherein the low-frequency sensor signal and the high-frequency event signal are differential signals.

9. The apparatus of claim 1, wherein the at least two sensors are connected individually to the coupling element.

10. A method, comprising:
    arranging at least two sensors in a rotating electrical machine for sensing a low-frequency sensor signal;
    decoupling a high-frequency event signal from a high-frequency electromagnetic field of the rotating electrical machine with antennas of the at least two sensors;
    connecting the at least two sensors via a common coupling element to a common HF evaluation apparatus; and
    transferring the high-frequency event signal from at least one of the at least two sensors via the common coupling element to the common HF evaluation apparatus and decoupling the high-frequency event signal from the low- frequency sensor signal.

11. The method of claim 10, wherein the common coupling element is designed as a transformer.

12. The method of claim 11, further comprising:
    connecting the at least two sensors to primary-side windings of the transformer in one-to-one correspondence;
    connecting a secondary-side winding of the transformer to the HF-evaluation apparatus; and
    coupling the primary-side windings to the secondary-side winding.

13. The method of claim 12, further comprising twisting the primary-side windings and the secondary-side winding together with one another.

14. The method of claim 10, further comprising connecting each of the at least two sensors to an LF evaluation apparatus which is designed to evaluate the low-frequency sensor signal and to decouple the high-frequency event signal.

15. The method of claim 10, wherein the low-frequency sensor signal and the high-frequency event signal are transferred differentially.

16. The method of claim 10, wherein the at least two sensors are connected individually to the common coupling element.

17. A control unit configured to carry out a method as set forth in claim 10.

18. A computer program embodied in a non-transitory computer readable medium, wherein the computer program, when loaded into a control unit and executed by the control unit, causes the control unit to carry out a method as set forth in claim 10.

19. A computer program product, comprising a computer program embodied in a non-transitory computer readable medium, wherein the computer program, when loaded into a control unit and executed by the control unit, causes the control unit to carry out a method as set forth in claim 10.

20. A rotating electrical machine, comprising an apparatus for sensing a high-frequency event signal in the rotating electrical machine, said apparatus comprising a HF evaluation apparatus, at least two sensors arranged in the rotating electrical machine and designed to sense a low-frequency sensor signal, each of the at least two sensors comprising an antenna for decoupling the high-frequency event signal from a high-frequency electromagnetic field of the rotating electrical machine, and a coupling element connecting the at least two sensors to the HF evaluation apparatus, said coupling element designed to transfer the high-frequency event signal from at least one of the at least two sensors to the HF evaluation apparatus and to decouple the low-frequency sensor signal.

* * * * *